United States Patent [19]
Smith et al.

[11] Patent Number: 5,809,103
[45] Date of Patent: Sep. 15, 1998

[54] X-RAY LITHOGRAPHY MASKING

[75] Inventors: Henry I. Smith, Sudbury, Mass.; Michael Lim, Duluth, Ga.; James Carter, Stoneham; Mark Schattenburg, Needham, both of Mass.

[73] Assignee: Massachusetts Institute of Technology, Cambridge, Mass.

[21] Appl. No.: 770,678

[22] Filed: Dec. 20, 1996

[51] Int. Cl.$^6$ ............................................ G21K 5/00
[52] U.S. Cl. .................................... 378/35; 378/210
[58] Field of Search .................... 378/35; 430/5

[56] References Cited

U.S. PATENT DOCUMENTS

| | | | |
|---|---|---|---|
| 3,743,842 | 7/1973 | Smith et al. | 250/320 |
| 4,170,512 | 10/1979 | Flanders et al. | |
| 4,254,174 | 3/1981 | Flanders et al. | |
| 4,698,285 | 10/1987 | Ehrfeld et al. | 378/35 |
| 4,735,877 | 4/1988 | Kato et al. | 378/35 |
| 5,111,491 | 5/1992 | Imai et al. | 378/35 |

FOREIGN PATENT DOCUMENTS

| | | |
|---|---|---|
| 60-160689 | 8/1987 | Japan . |
| 60-261777 | 11/1987 | Japan . |

*Primary Examiner*—Craig E. Church
*Attorney, Agent, or Firm*—Fish & Richardson P.C.

[57] ABSTRACT

X-ray masking apparatus includes a frame having a supporting rim surrounding an x-ray transparent region, a thin membrane of hard inorganic x-ray transparent material attached at its periphery to the supporting rim covering the x-ray transparent region and a layer of x-ray opaque material on the thin membrane inside the x-ray transparent region arranged in a pattern to selectively transmit x-ray energy entering the x-ray transparent region through the membrane to a predetermined image plane separated from the layer by the thin membrane. A method of making the masking apparatus includes depositing back and front layers of hard inorganic x-ray transparent material on front and back surfaces of a substrate, depositing back and front layers of reinforcing material on the back and front layers, respectively, of the hard inorganic x-ray transparent material, removing the material including at least a portion of the substrate and the back layers of an inside region adjacent to the front layer of hard inorganic x-ray transparent material, removing a portion of the front layer of reinforcing material opposite the inside region to expose the surface of the front layer of hard inorganic x-ray transparent material separated from the inside region by the latter front layer, and depositing a layer of x-ray opaque material on the surface of the latter front layer adjacent to the inside region.

22 Claims, 5 Drawing Sheets

X-RAY LITHOGRAPHY MASKING

This invention was made with government support under Contract Number N00019-95-K-0131 awarded by the Advanced Research Projects Agency through the Department of the Navy and Contract Number NAS8-38249 awarded by the National Aeronautics and Space Administration (NASA). The government has certain rights in the invention.

This invention relates to fabricating masks for x-ray lithography, and the improved configuration.

For background reference is made to U.S. Pat. Nos. 3,743,842 and 4,254,174. X-ray lithography is useful for making semiconductor integrated circuits. An x-ray lithography system typically includes a mask, a source of x-rays, and a positioner for positioning the mask relative to a substrate while a flux of x-rays passes through the mask to expose a radiation-sensitive film (also known as resist) on the substrate. In this way, a pattern on the mask is imaged upon the radiation-sensitive film on the substrate.

The mask is held in close proximity to the substrate. For example, if the minimum feature size on the mask is about 100 nm, the recommended mask-sample gap (G) to obtain a faithful reproduction of the mask pattern is typically 10 to 15 microns. If the minimum feature size is instead 50 nm, the corresponding recommended maximum mask sample gap would be typically 2.5 to 4 microns. That is, the gap is proportional to the square of the minimum feature size.

It is an important object of this invention to provide an improved x-ray lithography mask configuration and method of forming.

According to the invention, an absorber pattern is formed on the side of a hard inorganic membrane away from the substrate.

Numerous other features, objects and advantages of the invention will become apparent from the following detailed description when read in connection with the accompanying drawings in which.

Figure 1:
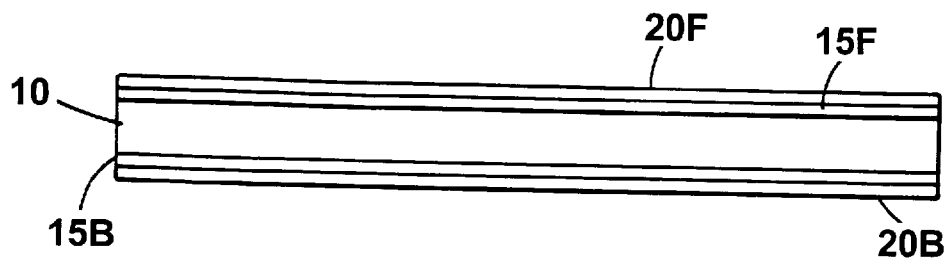
FIG. 1 is a cross-sectional view of a Si wafer coated with a film and Si layer.

With reference to the drawings, FIG. 1 shows a cross-sectional view of a Si wafer 10 coated on front and back sides (top and bottom) with hard inorganic films 15F, 15B of thickness of 1 to 2 micrometers and polycrystalline or amorphous Si layers 20F, 20B. The films 15F, 15B and layers 20F, 20B may be deposited on the Si wafer 10 using chemical vapor deposition processes well known in the art. The processes for depositing SiC or SiNx films 15F, 15B are commonly applied in making conventional x-ray masks, and the methods for depositing the Si layers 20F, 20B are well known in the semiconductor art.

Figure 2:
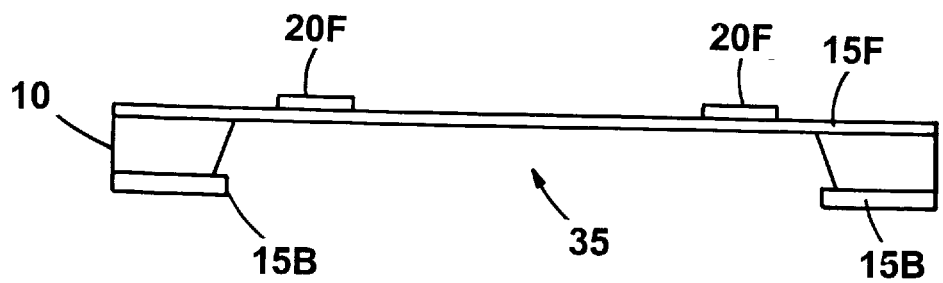
FIG. 2 is a cross-sectional view of the Si wafer after processing to leave the film as a membrane supported on the remaining ring of the Si wafer.

FIG. 2 is a cross-sectional view of the structure of FIG. 1 following removal of the deposited Si layer 20B from the back side or bottom of Si wafer 10, etching of an opening in the bottom film 15B and wafer 10 and patterning of the front or top layer 20F in the form of a continuous ring suitable for anodic bonding. The etching of film 15B provides a limited area in which the Si wafer 10 material can be chemically etched, using a KOH solution, or any of the other well known etchants of Si (e.g, ethylene-diamine pyrocatechol, tetramethyl ammonium hydroxide, gallic acid) to form a ring consisting of the remaining Si wafer 10 that supports the hard inorganic film membrane 15F and surrounds enclosed x-ray transparent region 35. Membrane 15F, usually one to a few micrometers thick, is made of a material of low atomic number, such as Si, SiC, Si3N4, or diamond for carrying absorbing material of high atomic number, such as gold, uranium, tungsten, tantalum, or an alloy of one of these materials, patterned to selectively absorb incident x-rays corresponding to a desired pattern to be imaged on a substrate exposed with soft x-rays through the mask.

Figure 3:
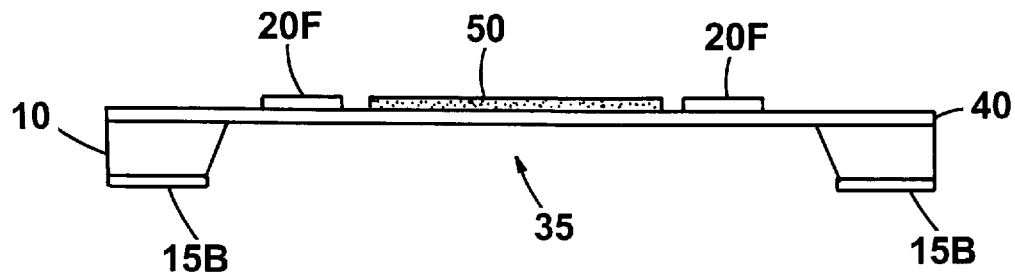
FIG. 3 is a cross-sectional view of the structure of FIG. 2 after depositing material suitable for strong absorption of soft x-rays.
Figure 4:
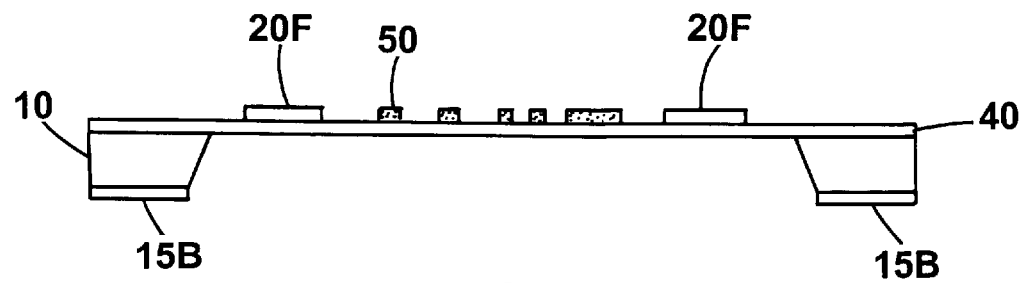
FIG. 4 is a cross-sectional view of the structure of FIG. 3 following patterning the deposited material.

FIG. 3 shows a cross-sectional view of the structure of FIG. 2 with the absorbing material 50 deposited on membrane 15F using methods described, for example, by Mondol et al. in "Uniform-Stress Tungsten on X-ray Mask Membranes via He-Backside Temperature Homogenization", Journal of Vacuum Science Technology B, vol. 12. pp. 4024, 4027 (1994). Absorbing material may then be patterned using electron beam lithography, or other means known in the art, followed by an etching process such as reactive ion etching. FIG. 4 is a cross-sectional view of the structure of FIG. 3 with absorbing material 50 patterned.

Figure 5:
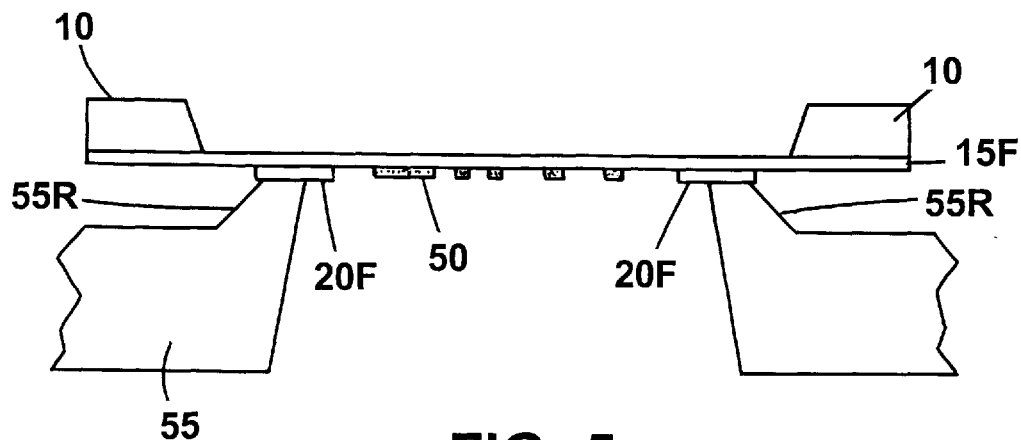
FIG. 5 is a cross-sectional view of the structure of FIG. 4 in a position for anodic bonding to a frame.

FIG. 5 is a cross-sectional view of the structure of FIG. 4 inverted with the annular ring 20F contacting raised rim 55R, commonly referred to as a mesa rim or a pedestal, of a frame 55, typically of glass, Si or SiC. Annular ring 20F is bonded to rim 55R, typically by anodic bonding. Anodic bonding involves heating frame 55 and membrane 15F, and applying a high voltage between the deposited Si film 20F and an electrode (not shown) located under frame 55. Other forms of bonding, including, for example, epoxy bonding are also possible. A suitable anodic bonding method is described, for example, by Schattenburg, et al. in "Fabrication of Flip-Bonded Mesa Masks for X-ray Lithography", Journal of Vacuum Science Technology B, volume 11, pp. 2906–2909 (1993); and by A. Moel et al. in "Fabrication and characterization of High-Flatness Mesa-Etched Silicon Nitride X-ray Masks", Journal of Vacuum Science Technology B, vol. 9, pp. 3287–3291 (1991).

Figure 6:
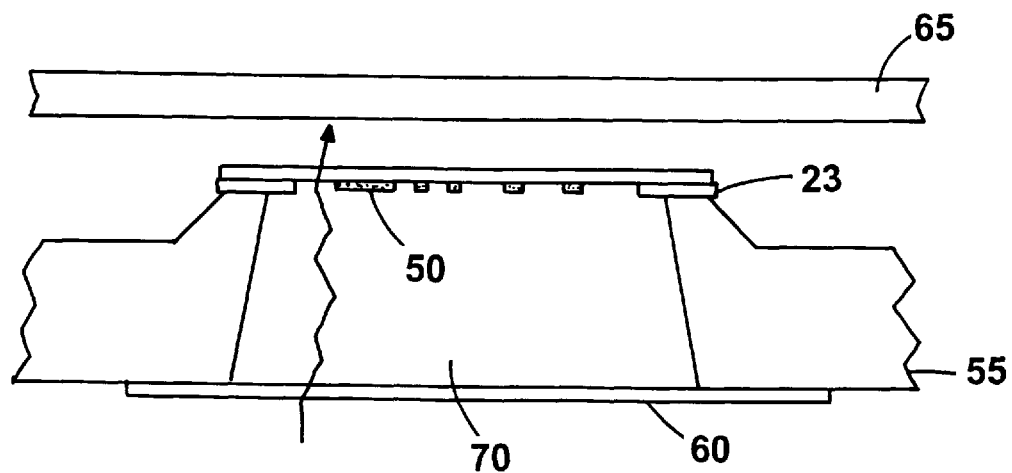
FIG. 6 is a cross-sectional view of the completed X-ray mask following attachment of a pellicle to the back of the frame.

FIG. 6 is a cross-sectional view of the completed x-ray mask with a pellicle membrane 60 bonded to the back side of frame 55 positioned to form an x-ray image of the patterned layer 50 on a substrate 65 when x-ray energy illuminates the mask. Pellicles have been used for many years in the semiconductor industry to protect photomasks (also called reticles) from accumulating dust particles or other contaminants that would interfere with the projection of a high quality image in an optical projection system. Dust particles can accumulate on the pellicle, but such pellicles are located at a significant distance from the plane of the reticle. This distance is chosen to exceed the depth-of-focus of the optical projection system. This way any dust particle on the pellicle is likewise outside the depth-of-focus of the optical projection system. At such distances, dust particles have negligible detrimental effects.

The possible use of pellicles in x-ray lithography has been discussed previously, but in all such cases it was envisioned that the pellicle would be placed immediately between an absorber pattern and a substrate. But a pellicle thus located has the potential of interfering with mask-sample gap and hence the quality of pattern replication. In contrast, when the pellicle 60 is located a suitable distance away from the absorber material 50 and outside the region between absorber material 50 and the substrate 65 to be exposed, absorber material 50 resides in a dust-free enclosure 70. This enclosure 70 may be filled with He gas to prevent oxidation or the buildup of contamination. Furthermore, pellicle 60 can be made of any x-ray transmitting membrane material, including Si, SiC, SiN, diamond, polyimide, and other x-ray transparent materials.

The mask configuration according to the invention with absorber material 50 on the back side of membrane 15F facilitates removal of dust particles. Another advantage is that any accidental contact between the mask and the substrate 65 is with membrane 15F made of very hard material and deformable so that damage from such contact is unlikely to occur.

The distance between pellicle 60 and absorber material 50 is preferably such that the diffraction pattern from any dust particle that lands on pellicle 60 is sufficiently blurred that it has no deleterious effect on the x-ray lithography. That distance is estimated as follows: let D be the diameter of the dust particle and lambda ($\lambda$) be the wavelength of the exposing x-rays. The gap, G, between the pellicle 60 and absorber material 50 is preferably much greater than $D^2/\lambda$. Expressing this mathematically, $$G >> D^2/\lambda.$$

A reasonable value would be $$G = 10\ D^2/\lambda$$

If D=1 micrometer and $\lambda$=1 nanometer then G=1 cm. If the x-ray source subtends an angle of a few milliradians, as is typical for good imaging quality, penumbra will further contribute to blurring of the image of a dust particle.

Another advantage of the invention is that it facilitates detecting dust particles and removing them from membrane 15F by reflection of an intense light beam, such as a laser beam. An intense light beam incident on membrane 15F produces specular reflection from the smooth membrane surface and scattering from dust particles. If the absorber pattern were on the front side, the pattern would also scatter incident light and make dust particle detection difficult.

Various methods exists to remove the dust particles from a surface. These methods of removal include scrubbing the surface with fine brushes, high pressure jets, impinging a beam of frozen carbon dioxide or argon, or using a high power excimer laser (see for example, "Efficient pulsed laser removal of 0.2 micron particles from a solid surface" by W. Zapke, W. Ziemlich and A. C. Tam, Applied Physics Letters, vol. 58, pp. 2217–2219, May 20, 1991). The present invention facilitates removal of the dust particles by using the above-mentioned removal techniques. In contrast, the removal techniques could not be so readily applied to the surface containing the absorber pattern because they might damage the pattern, or wedge dust particles or other contaminants into the interstices of the absorber pattern.

Figure 7:
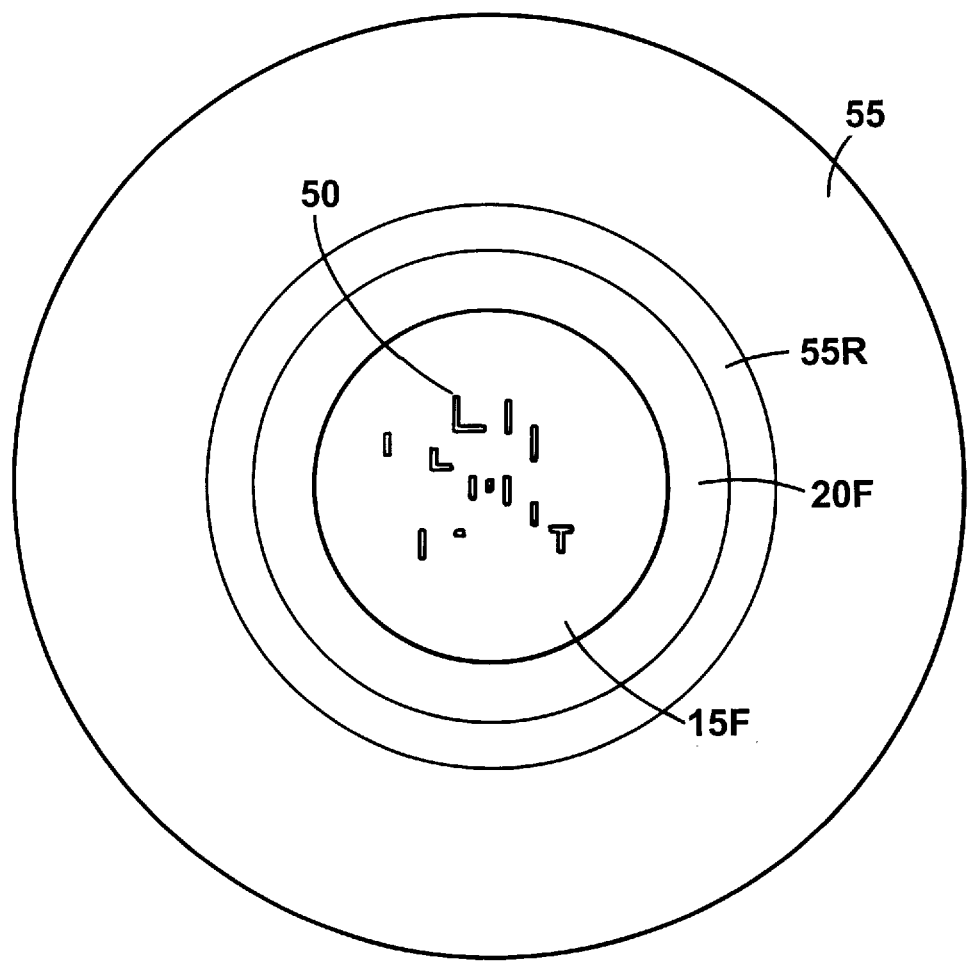
FIG. 7 is a plan view of the completed x-ray mask with patterned absorber on the membrane in which the edge reinforcement has a circular format.

FIG. 7 is a plan view of the x-ray mask with absorber material 50 on a membrane 15F, and a circular edge reinforcement 20F. The edge reinforcement 20F serves as a bonding agent for the anodic bonding and provides a mechanical transition between the rigid mesa rim 55R and the thin, readily deformed mask membrane 15F, thereby reducing the risk of accidental breakage of membrane 15F. The edge reinforcement 20F also serves as an aperture restricting the area of x-ray flux incident on the substrate 65 to be exposed. Having this aperture integral with the mask membrane 15F provides a sharp shadow edge.

Figure 8:
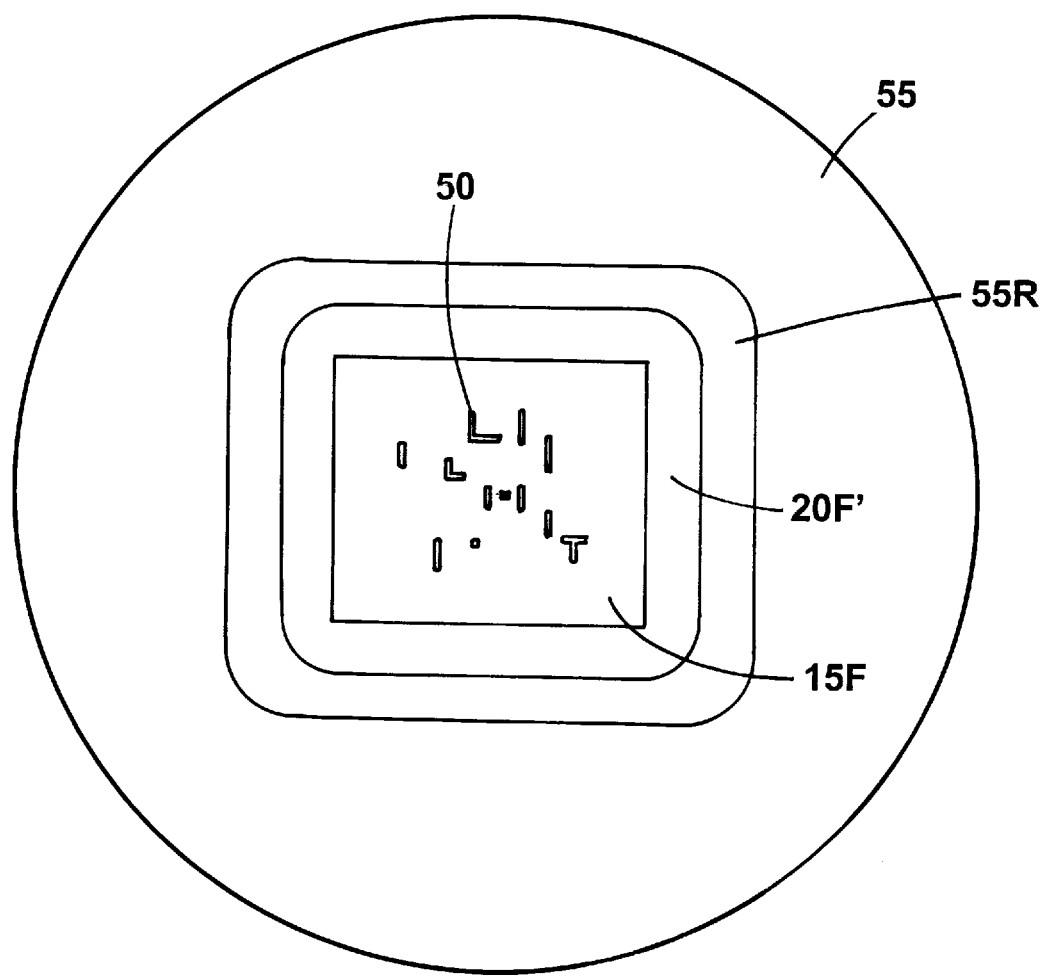
FIG. 8 is a plan view of the completed mask with patterned absorber on the membrane in which the edge reinforcement has a square format.

FIG. 8 shows a plan view of a modification of the mask of FIG. 7 having a square edge reinforcement 20F'. The square form is advantageous for the fabrication of Si integrated circuits whose patterns are also in a similar shape. It is advantageous to sharply define the boundaries of the chip exposed through such an exposure aperture.

Other embodiments are within the claims.

What is claimed is:

1. X-ray masking apparatus comprising,
   a frame having a supporting rim surrounding an x-ray transparent region,
   a thin membrane of hard inorganic x-ray transparent material attached at its periphery to said supporting rim covering said x-ray transparent region,
   a layer of x-ray opaque material on said thin membrane inside said x-ray transparent region and arranged in a pattern to selectively transmit x-ray energy through said membrane from said x-ray transparent region to a predetermined image plane separated from said layer by at least said thin membrane, and
   a pellicle membrane of x-ray transparent material attached to said frame, spaced from said thin membrane, and covering the x-ray transparent region,
   whereby a substrate may be positioned in said predetermined image plane and receive an x-ray energy image corresponding to said pattern when x-ray energy enters said x-ray transparent region.

2. X-ray masking apparatus in accordance with claim 1 and further comprising an edge reinforcement connected to and between said periphery and said supporting rim.

3. X-ray masking apparatus in accordance with claim 1, wherein the pellicle membrane is spaced from said thin membrane by a distance G,
   said distance G being sufficiently large so that the x-ray image in said image plane of a dust particle on said pellicle membrane is significantly defocused.

4. X-ray masking apparatus in accordance with claim 3 wherein said distance G is significantly larger than the ratio of the square of the diameter of said dust particle to the wavelength of said x-ray energy.

5. X-ray masking apparatus in accordance with claim 4 wherein said distance G is at least about ten times larger than the ratio of the square of the diameter of said dust particle to the wavelength of said x-ray energy.

6. X-ray masking apparatus in accordance with claim 2, wherein the pellicle membrane is spaced from said thin membrane by a distance G being sufficiently large so that the x-ray image in said image plane of a dust particle on said pellicle membrane is significantly defocused.

7. X-ray masking apparatus in accordance with claim 6 wherein said distance G is significantly larger than the ratio of the square of the diameter of said dust particle to the wavelength of said x-ray energy.

8. X-ray masking apparatus in accordance with claim 7 wherein said distance G is at least about ten times larger than the ratio of the square of the diameter of said dust particle to the wavelength of said x-ray energy.

9. X-ray masking apparatus in accordance with claim 1 wherein said hard inorganic x-ray transparent material is from the group consisting of Si, SiC, SiN, diamond and polyimide.

10. X-ray masking apparatus in accordance with claim 2 wherein said edge reinforcement is made of silicon.

11. A method of making an x-ray masking apparatus comprising, depositing a layer of x-ray transparent material on a substrate, removing a portion of said substrate to expose said x-ray transparent layer and thereby form an x-ray transparent membrane, depositing x-ray opaque material on the membrane, and after depositing the x-ray opaque material, attaching a frame to the membrane.

12. A method of making x-ray masking apparatus in accordance with claim 11 and further comprising patterning said x-ray opaque material to selectively absorb incident x-rays corresponding to a desired pattern to be imaged on a substrate exposed with soft x-rays through the x-ray masking apparatus.

13. The method of claim 11, wherein the x-ray opaque material is deposited on the side of the membrane opposite the removed portion of the substrate, and wherein the frame is attached to the side of the membrane supporting the x-ray opaque material.

14. A method of making x-ray masking apparatus in accordance with claim 11, and further comprising attaching a pellicle to said frame spaced from the x-ray transparent layer.

15. The method of claim 11, wherein the x-ray transparent material is a hard inorganic material.

16. The method of claim 11, wherein the frame is attached to the membrane by epoxy bonding.

17. The method of claim 11, wherein the frame is attached to the membrane by anodic bonding.

18. The method of claim 11, further comprising prior to removing the portion of the substrate, depositing a layer of reinforcing material on the x-ray transparent layer, and prior to depositing the x-ray opaque material, removing a portion of said reinforcing layer to expose the x-ray transparent layer, wherein the frame is attached to the x-ray transparent membrane by using an unremoved portion of the reinforcing layer as a bonding agent.

19. The method of claim 18, wherein the frame is attached to the x-ray transparent membrane by anodic bonding.

20. The method of claim 18, wherein the reinforcing material is silicon.

21. The method of claim 11, wherein the x-ray opaque material is deposited on the side of the membrane opposite the removed portion of the substrate.

22. The method of claim 11, wherein the frame is attached to the side of the membrane supporting the x-ray opaque material.

* * * * *